US 8,880,210 B2
// Nov. 4, 2014

(12) United States Patent
Porthouse et al.

(10) Patent No.: US 8,880,210 B2
(45) Date of Patent: Nov. 4, 2014

(54) METHODS AND APPARATUS FOR PROCESSING SUBSTRATES USING MODEL-BASED CONTROL

(75) Inventors: Keith Brian Porthouse, Sunnyvale, CA (US); John W. Lane, San Jose, CA (US); Mariusch Gregor, Gilroy, CA (US); Nir Merry, Mountain View, CA (US); Michael R. Rice, Pleasanton, CA (US); Alex Minkovich, Campbell, CA (US); Hongbin Li, Mountain View, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 551 days.

(21) Appl. No.: 13/183,520

(22) Filed: Jul. 15, 2011

(65) Prior Publication Data

US 2013/0018500 A1    Jan. 17, 2013

(51) Int. Cl.
*G06F 19/00* (2011.01)
*G05B 17/02* (2006.01)
*H01L 21/67* (2006.01)
*G05D 16/20* (2006.01)

(52) U.S. Cl.
CPC ............ *G05D 16/2046* (2013.01); *G05B 17/02* (2013.01); *H01L 21/67253* (2013.01); *H01L 21/67017* (2013.01)
USPC ........................................................ 700/104

(58) Field of Classification Search
CPC .................... H01L 21/67017; H01L 21/67253
USPC ................................................. 700/104, 121
See application file for complete search history.

(56) References Cited

U.S. PATENT DOCUMENTS 5,772,501 A * 6/1998 Merry et al. ................... 454/256
6,478,923 B1 * 11/2002 Igarashi .................... 156/345.26
7,204,155 B2 * 4/2007 Lane et al. ....................... 73/861

(Continued)

FOREIGN PATENT DOCUMENTS

JP      2001257164 A      9/2001
KR      100874895 B1      12/2008

OTHER PUBLICATIONS

Martin Rostan, et al., "EtherCAT enabled Advanced Control Architecture", 2010 IEEE/SEMI Advanced Semiconductor Manufacturing Conference (ASMC), Jul. 11-13, 2010.

(Continued)

*Primary Examiner* — Mohammad Ali
*Assistant Examiner* — Sivalingam Sivanesan
(74) *Attorney, Agent, or Firm* — Moser Taboada; Alan Taboada

(57) ABSTRACT

Methods and apparatus are disclosed herein. In some embodiments, methods of controlling process chambers may include predetermining a relationship between pressure in a processing volume and a position of an exhaust valve as a function of a process parameter; setting the process chamber to a first state having a first pressure in the processing volume and a first value of the process parameter, wherein the exhaust valve is set to a first position based on the predetermined relationship to produce the first pressure at the first value; determining a pressure control profile to control the pressure as the process chamber is changed to a second state having a second pressure and a second process parameter value from the first state; and applying the pressure control profile to control the pressure by varying the position of the exhaust valve while changing the process chamber to the second state.

21 Claims, 6 Drawing Sheets

(56) References Cited

U.S. PATENT DOCUMENTS

| | | | |
|---|---|---|---|
| 7,437,944 B2* | 10/2008 | Melcer et al. | 73/861 |
| 7,896,967 B2* | 3/2011 | Hayasaka et al. | 118/715 |
| 8,321,046 B2* | 11/2012 | Sueyoshi et al. | 700/108 |
| 2006/0175012 A1* | 8/2006 | Lee | 156/345.29 |
| 2008/0176412 A1* | 7/2008 | Komeda | 438/778 |

OTHER PUBLICATIONS

International Search Report and Written Opinion mailed Feb. 26, 2013 for PCT Application No. PCT/US2012/046452.

* cited by examiner

METHODS AND APPARATUS FOR PROCESSING SUBSTRATES USING MODEL-BASED CONTROL

FIELD

Embodiments of the present invention generally relate to methods and apparatus for processing substrates in substrate processing systems.

BACKGROUND

Substrate processing systems include a process chamber having a processing volume where a substrate may be disposed on a substrate support. One or more process gases may be flowed into the processing volume to process the substrate. Typically, in such systems, chamber pressure and process gas flow are controlled separately. For example, gas flow rates are set by flow controllers, such as mass flow controllers or the like. Similarly, pressure levels are set at an exhaust valve from the chamber, such as a throttle valve or the like. Flow rates can then be modified after pressure levels are set to adjust for residence time effects in the processing volume. In addition, when switching between processes at different flow rates and/or chamber pressures, substrate processing can be slowed while waiting for the system to stabilize at the second flow rate and/or chamber pressure.

Thus, the inventors have provided improved methods and apparatus for processing substrates.

SUMMARY

Methods and apparatus for processing a substrate using model-based pressure control are provided herein. In some embodiments, a method of controlling a process chamber having a processing volume includes predetermining a relationship between pressure in the processing volume and a position of an exhaust valve as a function of a process parameter; setting the process chamber to a first state having a first pressure in the processing volume and a first value of the process parameter, wherein the exhaust valve is set to a first position based on the predetermined relationship to produce the first pressure in the processing volume at the first value; determining a pressure control profile to control the pressure in the processing volume as the process chamber is changed to a second state having a second pressure and a second value of the process parameter from the first state, wherein the pressure control profile is determined from a model based control algorithm that uses the first pressure, the second pressure, the first value, the second value, and the first position as input parameters; and applying the pressure control profile to control the pressure in the processing volume by varying the position of the exhaust valve while changing the process chamber to the second state from the first state.

In some embodiments, a method of controlling a process chamber having a processing volume and an exhaust valve for controlling a pressure in the processing volume may include setting the process chamber to a first state having a first pressure in the processing volume and a first value of a process parameter, wherein the exhaust valve is set to a first position to produce the first pressure in the processing volume at the first value based on a predetermined relationship between pressure in the processing volume and the position of the exhaust valve as a function of the process parameter; and applying a pressure control profile to control the pressure in the processing volume by varying the position of the exhaust valve while changing the process chamber to a second state having a second pressure and a second value of the process parameter from the first state, wherein the pressure control profile is determined from a model based control algorithm that uses the first pressure, the second pressure, first value, the second value, and the first position as input parameters.

In some embodiments, a system for processing semiconductor substrates includes a process chamber having a processing volume, a processing source to provide a process parameter to the processing volume; a exhaust valve disposed between the processing volume and an exhaust volume of an exhaust system; and a controller coupled to the process chamber, wherein the controller further comprises computer readable medium having instructions stored thereon that, when executed by the controller, cause the controller to perform embodiments of the method of controlling the process chamber described above or other and further embodiments of the method of controlling the process chamber described below.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
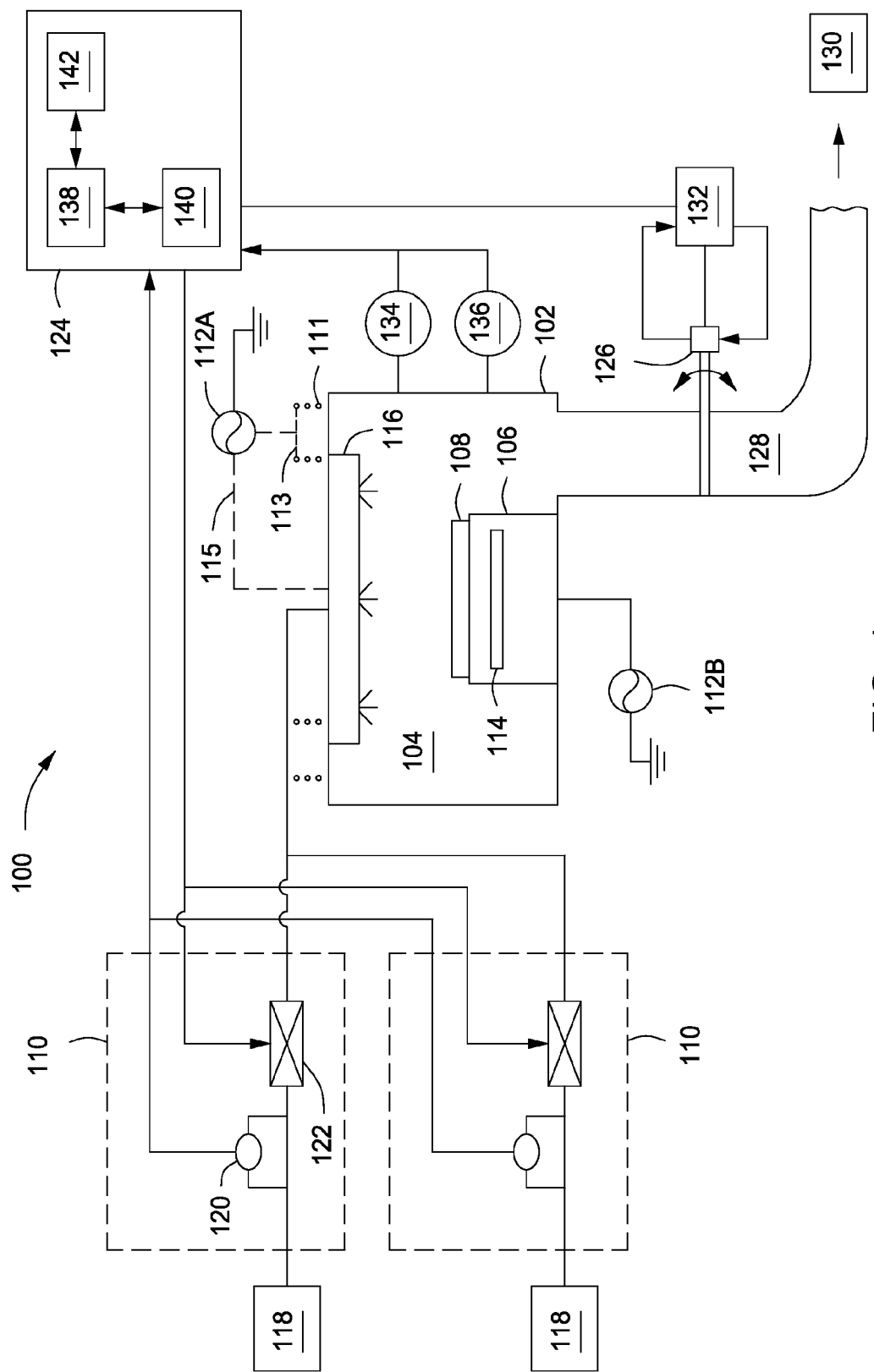
FIG. 1 depicts a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for processing a substrate using model-based control are provided herein. Embodiments of the inventive methods and apparatus may advantageously provide a faster transient response, such as stabilizing the chamber pressure at a new setpoint value when the chamber pressure is changed as a result of a change in processing conditions or the like. Further, embodiments of the inventive methods and apparatus may advantageously provide feed-forward control that facilitates anticipating process changes in the substrate processing system. The feed-forward control can advantageously facilitate more efficient substrate processing and/or higher throughput, for example, by reducing time spent waiting for stabilization of process conditions. Embodiments of the inventive methods provided herein can also be used as a standardized tuning procedure in substrate processing systems to facilitate improved chamber matching between systems.

FIG. 1 depicts a substrate processing system 100 in accordance with some embodiments of the present invention. The substrate processing system 100 may include a process chamber 102 having a processing volume 104. A substrate support 106 may be disposed in the processing volume 104 to support a substrate 108 during processing in the substrate processing system 100. The process chamber 102 may be any suitable process chamber for processing a substrate and/or multiple substrates simultaneously. For example, the process chamber 102 may be configured for one or more of chemical vapor deposition (CVD), atomic layer deposition (ALD), physical vapor deposition (PVD), metal chemical vapor deposition (MCVD), blanket deep sub-micron chemical vapor deposition (blanket DSM-CVD) or any suitable plasma or non-plasma enabled or enhanced processes, such as etching, deposition, cleaning, or the like. The substrate support 106 may be any suitable substrate support for use with any suitable configurations of the process chamber 102. The substrate support 106 may include one or more of a susceptor, electrostatic chuck, heater, RF electrode, lift pin assembly, or the like.

The system 100 may include one or more processing sources to provide one or more process parameter to the processing volume 104. For example, process parameters may include a magnitude of RF power, a flow rate of a process gas, a temperature of a chamber component, chamber temperature, chamber pressure, foreline pressure, susceptor backside pressure, process gas type, process gas temperature, susceptor temperature, susceptor position, substrate heater power level, exhaust valve heater power level, exhaust valve heater temperature, exhaust valve position, process recipe step or the like. For example, the one or more process may be provided by processing sources, such as one or more flow devices, one or more radio frequency (RF) power sources, a substrate heater, exhaust valve heater or the like.

For example, one or more flow devices 110 may be coupled to a gas inlet 116 to provide one or more process gasses to the processing volume 104. The gas inlet 116 may be any suitable inlet or inlets for providing the one or more process gases to the processing volume 104 in a desired manner (such as into a region of the processing volume 104 above the substrate 108, directed towards the substrate 108, directed across the surface of the substrate 108, or the like). For example, the gas inlet 116 may be one or more of a showerhead (as shown), a gas injector, nozzles, or the like. Although illustrated in FIG. 1 as being disposed above the substrate support 106, the gas inlet 116 may be disposed, alternatively or in combination, in sidewalls or bottom of the process chamber 102, or within the process chamber (for example, adjacent to the substrate support 106). Each of the one or more flow devices 110 may be coupled to one or more of a plurality of gas sources 118. For example, the plurality of gas sources 118 may be part of a gas panel or the like, wherein each flow device 110 controls the flow of a process gas from a corresponding gas source 118 to the gas inlet 116.

One or more RF power sources may be used to provide RF power to various portions of the processing system 100, such as the processing volume 104 to form a plasma from the process gas or some other gas or gases flowed into the processing volume 104, or to the substrate support 106, or the like. For example, a first RF power source 112A and a second RF power source 112B are depicted in FIG. 1. The first and second RF power sources 112A, 112B are collectively referred to herein as the one or more RF power sources 112, or the RF power source 112. Each RF power source generally includes an RF generator and a matching circuit used to match the impedance of the RF generator and the plasma. The one or more RF power sources may be coupled to various elements in the substrate processing system 100.

The first RF power source 112A may be utilized to facilitate forming a plasma from the one or more process gases. In some embodiments, the first RF power source 112A may be disposed proximate a lid or ceiling of the process chamber 102. For example, the first RF power source 112A may be configured to couple RF energy to the one or more process gases within the process chamber 102 to form a plasma. In some embodiments, the first RF power source 112A may be coupled to an electrode such as one or more inductive coils 111 disposed above the ceiling of the process chamber 102, for example as shown by dashed line 113. Alternatively or in combination, the first RF power source 112A may be coupled to an electrode disposed in or near the ceiling of the process chamber, such as a conductive portion of the gas inlet 116, as shown by dashed line 115. The first RF power source 112A may also or alternatively be coupled to other suitable components to provide RF energy in a desired location. Although a single RF source (e.g., 112A) is shown coupled to the process chamber 102 proximate the ceiling, multiple RF power sources may be coupled to the ceiling at the same electrode or to different electrodes.

The second RF power sources 112B may be coupled to the substrate support 106, for example, to provide substrate bias control during processing. Similar as described above, although a single RF source is shown coupled to the substrate support 106, multiple RF power sources may be coupled to the substrate support 106 at the same electrode or to different electrodes. In addition, or in the alternative, other RF power sources 112 may be coupled to other components of the process chamber such as electrodes (not shown) disposed in or near sidewalls of the process chamber or in other desired locations to couple RF energy to the process chamber or gases disposed in or flowing into the process chamber 102.

Each of the one or more flow devices 110 may be a mass flow device, such as a mass flow controller or the like. Each of the one or more flow devices 110 may include a sensor 120 and an adjustable valve 122. The sensor 120 may include one or more of a pressure sensor or a temperature sensor. As shown in FIG. 1, the sensor 120 and the adjustable valve 122 may be directly coupled to a controller 124. The controller 124 may be a centralized system controller for controlling each of the components of the system 100 and is discussed in more detail below. For example, in operation, the sensor may provide the controller 124 with a signal indicative of one or more of pressure or temperature of a process gas to determine a flow rate of a process gas and the controller 124 may adjust the flow rate as desired by controlling the adjustable valve 122.

This design of flow device 110 may be different from a typical flow device. For example, a typical flow device (not shown), such as a mass flow controller, may include a sensor and adjustable valve in communication with an onboard position controller to provide local closed loop control between the flow sensor, the adjustable valve and the onboard position controller. The onboard position controller of the typical flow device controls the tuning and optimization of the flow rate in response to a signal from a system controller. Unfortunately, this conventional design of the typical flow device may require a unique control approach between the onboard position controller and the system controller 124 dependent on the manufacturer's specifications, control settings or the like. Further, because of the intermediate controller (i.e., the onboard position controller of a typical flow device), the response to any commands from the system controller 124 may be slowed because the signal is first relayed to the intermediate controller and then the intermediate controller subsequently controls the tuning and optimization of the typical flow device (rather than the system controller 124 directly controlling the flow control device 110). Further, absence of the intermediate controller may advantageously allow for continuously varying flow commands, use of the flow control device 110 in a position control mode, allow for faster update rates from the system controller 124, or the like. However, a typical flow device (not shown), such as a mass flow controller, which may include a sensor and adjustable valve in communication with an onboard position controller to provide local closed loop control between the flow sensor, the adjustable valve and the onboard position controller may also be used with the methods of model-based control disclosed herein.

Accordingly, in embodiments of the present invention, and as illustrated in FIG. 1, the conventional position controller is omitted from the system, and the controller 124 is directly coupled to the flow sensor 120 and the adjustable valve 122 to directly control, tune and/or optimize each of the one or more flow devices 110.

The controller 124 may control others of the one or more processing sources, such as a substrate heater 114, the one or more RF power sources 112, an exhaust valve 126 (discussed below), an exhaust valve heater (not shown) or any other suitable processing source directly, for example, to tune or optimize the one or more chamber input sources and not through any intermediate control devices for the various chamber input sources. As discussed above for the one or more flow devices 110, direct control of each of the one or more processing sources by the controller 124 may facilitate faster transient response to changes in chamber inputs, such as temperature, pressure, or the like. Further, because a centralized system controller (i.e., the controller 124) is used, a standardized control approach may be used for each of the one or more processing sources instead of unique control approach for each of the various one or more processing sources.

The system 100 may further include a exhaust valve 126 disposed between the processing volume 104 and an exhaust volume 128 of an exhaust system 130. The exhaust valve 126 may be any suitable valve used in substrate processing systems, such as a gate valve, a throttle valve, a butterfly valve, pendulum valve or the like. The exhaust valve 126 is coupled to a motorized drive 132 to control a position of the exhaust valve 126. For example, a position change of the exhaust valve 126 may result in a greater or lesser exposure to a lower pressure region, such as in the exhaust volume 128 or the like. The lower pressure region may be generated by any suitable vacuum pump or similar pumping device (not shown) coupled to the exhaust region 128 or the exhaust system 130.

The pressure in the processing volume 104 may be monitored by one or more pressure gauges. For example, a first pressure gauge 134 may be used to measure a first range of pressure in the processing volume 104. In some embodiments, the first range of pressure may be about 1 to about 10 Torr. A second pressure gauge 136 may be used to measure a second range of pressure in the processing volume. The second range of pressure may be different from the first range of pressure, for example, one of the first or second pressure gauges may be a high pressure gauge and the other may be a lower pressure gauge. In some embodiments, the second range of pressure may be about 10 to about 500 Torr. The first and second pressure gauges 134, 136 may be any suitable pressure gauges for measuring the desired pressure ranges, for example, such as ion gauges, thermocouple gauges, capacitance gauges, strain gauges, Pirani gauges or the like. Additional pressure gauges may also be provided, if desired, for monitoring different pressure ranges. Providing multiple pressure gauges tuned for particular pressure ranges may advantageously facilitate more precise control of the processing system as compared to using a single pressure gauge over a wide range of pressures. For example, pressure gauges may be provided to monitor the exhaust volume 128, a backside of a susceptor, or the like.

The first and second pressure gauges 134, 136 may be directly coupled to the controller 124 as illustrated in FIG. 1. Similarly, the motorized drive 132 may be directly coupled to and controlled by the controller 124. As discussed above for the one or more flow devices 110, the configuration of the pressure gauges 134, 136 and the motorized drive 132 may differ from a conventional substrate processing system. For example, typical substrate processing systems may include one or more intermediate controllers to monitor pressure readings from the pressure gauges and to operate the motorized drive which controls the exhaust valve. For example, in a typical substrate processing system the pressure gauges may be coupled to a pressure controller and the pressure controller may further be coupled to a position controller which controls the motorized drive to change the position of the exhaust valve. For similar reasons as discussed above for the one or more flow devices 110, these intermediate controllers (e.g., the pressure controller and the position controller) are replaced by the controller 124. For example, in addition to the reasons above, the elimination of intermediate controllers may enable complex model-based control that can be used to account for higher-level parameters of the system, such as flow rate or the like.

The controller 124 comprises a central processing unit (CPU) 138, a memory 140, and support circuits 142 for the CPU 138 and facilitates control of the components of the system 100 and, as such, of methods of controlling the system, such as method 200 discussed below. The controller 124 may be one of any form of general-purpose computer processor that can be used in an industrial setting for controlling various chambers and sub-processors. The memory, or computer-readable medium, 140 of the CPU 138 may be one or more of readily available memory such as random access memory (RAM), read only memory (ROM), floppy disk, hard disk, or any other form of digital storage, local or remote. The support circuits 142 are coupled to the CPU 138 for supporting the processor in a conventional manner. These circuits include cache, power supplies, clock circuits, input/output circuitry and subsystems, and the like. As discussed above, the controller 124 may include circuitry and/or subsystems for directly controlling flow devices, motorized drives, RF power sources, substrate heaters, exhaust valve heaters, monitoring pressure gauges, and any suitable circuitry and/or subsystems to directly control various components of a substrate processing system. The memory 140 stores software (source or object code) that may be executed or invoked to control the operation of the system 100 in accordance with the embodiments of the invention as described herein.

Figure 2:
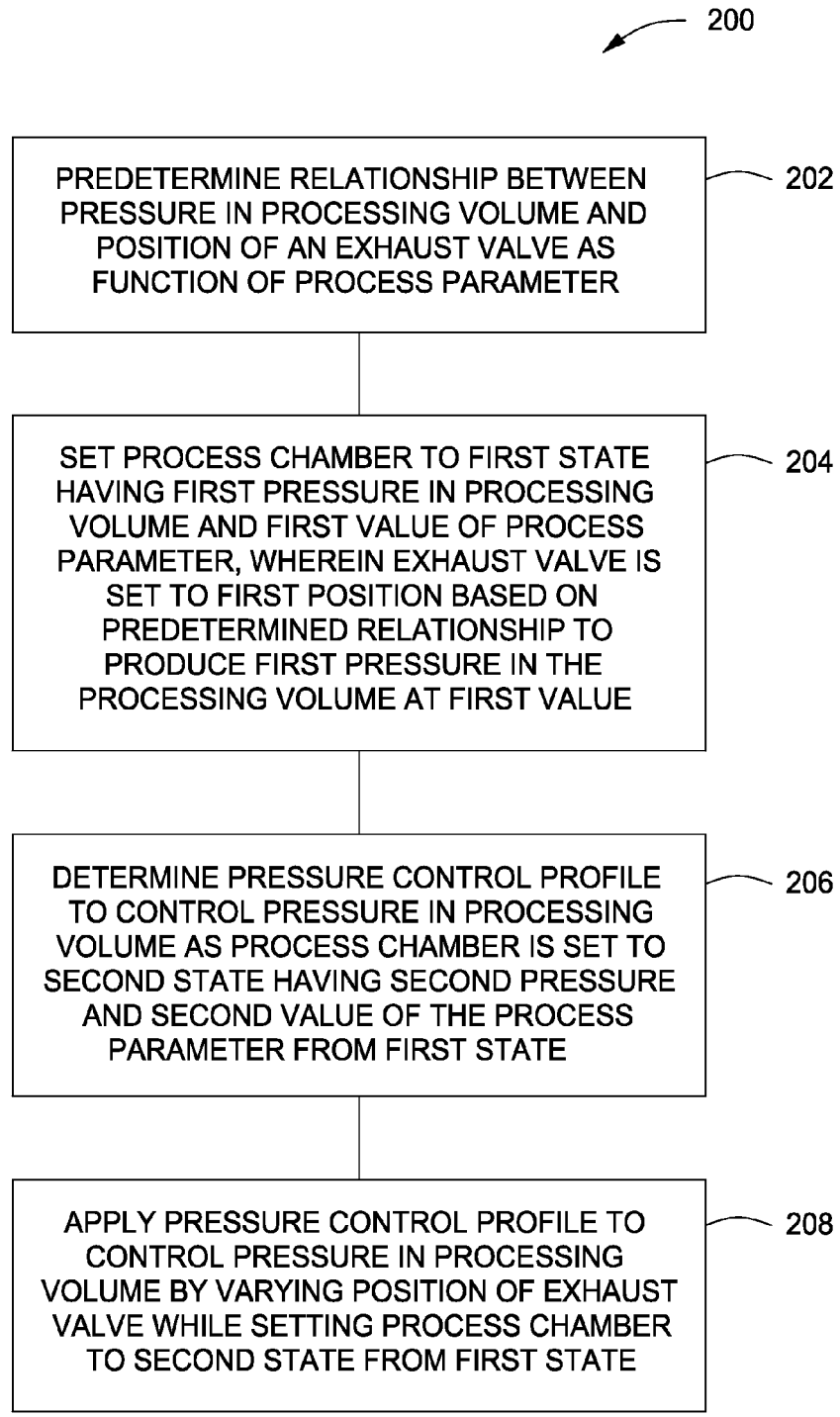
FIG. 2 depicts a flow chart of a method for controlling a process chamber in accordance with some embodiments of the present invention.
Figure 3:
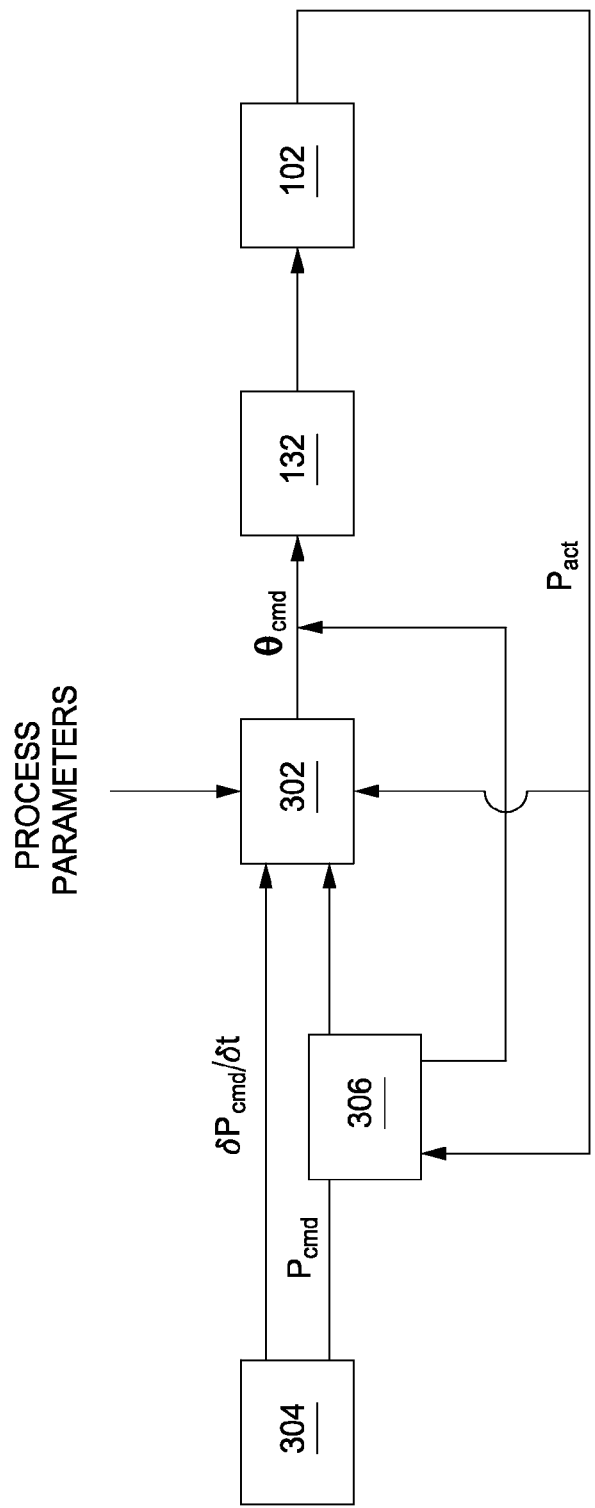
FIG. 3 depicts a control flow diagram in accordance with some embodiments of the present invention.

FIG. 2 depicts a flow chart for a method 200 of controlling a substrate processing system in accordance with some embodiments of the present invention. The method 200 is described below in accordance with the elements of the substrate processing system 100 depicted in FIG. 1 and a command flow diagram depicted in FIG. 3. However, the method 200 may be utilized in other substrate processing systems in accordance with the teachings provided herein. For example, the command flow diagram as depicted in FIG. 3 is an exemplary diagram illustrating an exemplary command flow for adjusting the position of the exhaust valve 126 to control pressure in the chamber 102. For example, some elements of the command flow diagram, such as a system model 302 and a pressure profile generator 304, may be disposed in the memory 140 of the controller 124 or in any suitable computer-readable medium accessible by the controller 124 or other controllers of the process system 100.

The method 200 begins at 202 by predetermining a relationship between pressure in the processing volume 104 and a position of the exhaust valve 126 as a function of a process parameter. For example, the process parameter may be one or more of a magnitude of RF power, a flow rate of a process gas, a temperature of a chamber component, or the like as discussed above.

For example, predetermining the relationship between pressure in the processing volume 104 and the position of the exhaust valve 126 may include modeling gas flow through the exhaust valve 126 as a function of the process parameter to determine the predetermined relationship. For example, the predetermined relationship may be a model (e.g., the system model 302) for the exhaust valve 126 which has one or more of chamber pressure ($P_c$), differential chamber pressure ($dP_c/dt$), chamber temperature ($T_c$), chamber volume ($V_c$) or the process parameter, such as a flow rate, as inputs and a position ($\theta_c$) of the exhaust valve 126 as an output. For example, the differential chamber pressure may be approximated as the difference between sum of all flow rates into the chamber volume ($V_c$) and the sum of all flow rates out of the chamber volume ($V_c$) divided by the chamber volume ($V_c$). The system model 302 may be a single volume model. For example, in the single volume model, the only conductance in the system that may be modeled may be the conductance of the exhaust valve 126. For example, in the single volume model, the conductance of additional components may be lumped into the conductance of the exhaust valve 126.

Alternatively, the system model 302 may be a multi-volume model with different conductances separating each volume. For example, separate volumes of a multi-volume model could be for one or more of a gas line, a showerhead, the process chamber, a foreline, the exhaust valve, or the like. Each of the separate volumes may be modeled as a tube, an orifice or the like. For example, in a real system of which the multi-volume model may approximate, it may be difficult to measure a pressure in each volume of the real system. Accordingly, it may not be possible to calculate gas flow rates through each of the separate volumes. To overcome these issues, the inventors postulate that a system dynamics model may be utilized to maintain estimates of the pressure in each of the separate volumes over time. For example, the system dynamics model may utilize a current flow rate into each volume and a current flow rate out of each volume to estimate a current pressure differential or rate of change in the pressure in each volume. This current pressure differential may be used to calculate a new estimate for pressure in each of separate volumes at a successive time step. For example, the system dynamics model may provide pressure estimates to one or more of the system model 302 and the pressure profile generator 304 in the command flow diagram of FIG. 3 for each of the separate volumes where individual pressure measurements are not possible.

For example, in the system model 302, the exhaust valve 126 may be modeled as one or more of a pipe, a choked orifice, an unchoked orifice or the like. For example, the exhaust valve 126 may be modeled as an approximated orifice—choked or unchoked—where gas flow rate is related to valve position and chamber pressure. Alternatively, for example, an effective area model, such as one that relates gas flow rate to chamber pressure, may be used as a model for the exhaust valve 126. Once a suitable model is selected for gas flow through the exhaust valve 126, the system model 302 may be empirically solved to determine one or more unknown parameters. For example, the one or more unknown parameters, may be specific to a particular geometry of the process chamber 102, a chamber volume, an effective open area of the exhaust valve as a function of valve angle, the change in conductance of the valve with pressure or the like. One exemplary method for empirically solving the system model 302 or predetermining the relationship between pressure in the processing volume and the position of the exhaust valve 126 is described by a flow chart illustrated in FIG. 4.

Figure 4:
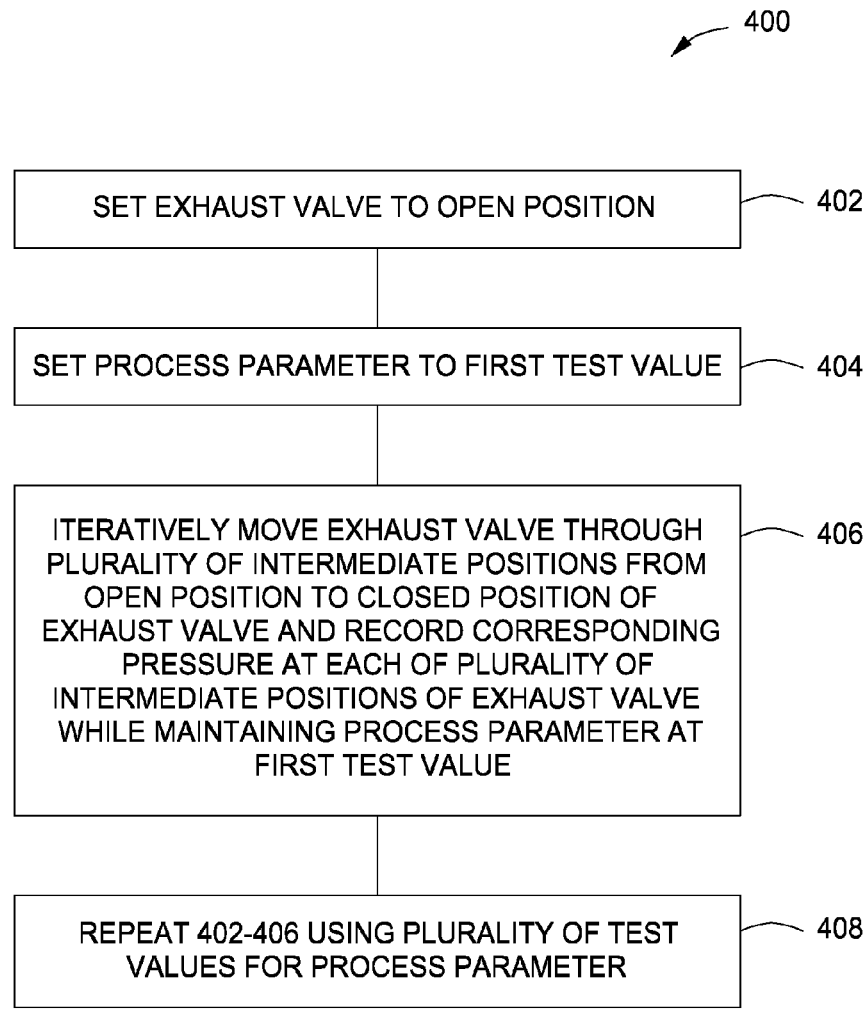
FIG. 4 depicts a flow chart of a method for determining a relationship between pressure in a processing volume and a position of an exhaust valve in accordance with some embodiments of the present invention.

FIG. 4 depicts a flow chart of one exemplary method 400 for predetermining the relationship between pressure in the processing volume 104 and the position of the exhaust valve 126. For example, the method 400 begins by selecting the system model 302 including a model for the exhaust valve 126 as discussed above. At 402, the exhaust valve 126 may be set to an open position. For example, the open position of the exhaust valve 126 may be a full open position capable of being reached by the exhaust valve 126, or any suitable maximum open position that will be utilized during processing in the process chamber 102. For example, in some embodiments, the open position of the exhaust valve may be set such that the base pressure in the chamber 102 is about 0.1 Torr or less.

At 404, once the open position has been set and the chamber pressure has stabilized, the process parameter may be set to a first test value. For example, the first test value may be a single process parameter, such as flow rate, or a number of process parameters such as flow rate, temperature, RF power or the like, such as suitable combinations of the process parameters listed above. For example, in some embodiments, the first test value may be a first flow rate of a first process gas.

For example, at 404, the chamber pressure may be monitored by a steady state or a transient approach. For example, in a steady state approach, the chamber pressure may be allowed to stabilize at the first test value, e.g., the first flow rate of the first process gas, when the exhaust valve 126 is at the open position. Then, the chamber pressure may be recorded once the conditions have stabilized. The steady state approach may then proceed to 406 as discussed below. For example, in a transient approach, once the chamber has stabilized at a base pressure when the valve 126 is set to the open position, the process parameter may be set to the first test value, and the chamber pressure may be monitored over a first period of time, for example, about 15 seconds. At the end of the first period of time, the process parameter, e.g., the flow of the first process gas at the first flow rate, may be turned off, and the chamber may be allowed to restabilize at the base pressure, and then the transient approach may proceed to 406 as discussed below. For example, in the transient approach, a pressure response curve may be generated for each valve position.

At 406, the position of the exhaust valve 126 may be iteratively moved through a plurality of intermediate positions from the open position to a closed position of the exhaust valve 126. While at each of the plurality of intermediate positions, the pressure in the processing volume may be permitted to stabilize. A corresponding pressure or pressure response curve at each of the plurality of intermediate positions of the exhaust valve 126 may be recorded for the process parameter at the first test value. The range of intermediate positions need not terminated at a closed position. For example, any suitable range of positions for the exhaust valve 126 may be utilized, such as positions that are typically used during chamber operation or the like to produce desired chamber conditions.

At 408, steps 402-406 may be repeated using a plurality of test values for the process parameter. For example, once a plurality of corresponding pressures or pressure response curves have been recorded at a plurality of intermediate positions as a function of a plurality of test values, the system model 302 may be solved by determining the one or more unknown parameters. For example, the system model 302 may be solved empirically, for example such as using a non-linear optimization method or the like. For example, a non-linear optimization method may be necessary to solve the system model 302 when the exhaust valve 126 is modeled as an orifice using either the steady state or transient approach. Alternatively, for example, when the system model 302 uses an effective area model for the exhaust valve 126, the number of unknown parameters may be reduced relative to the other models for the exhaust valve 126 and the system model 302 may be solved directly for the unknown parameters. Accordingly, once the system model 302 has been solved as discussed above, the predetermined relationship (e.g., the solved system model 302) between pressure in the processing volume 104 and the position of the exhaust valve 126 as a function of the process parameter may be used for chamber processes.

The method 400 for predetermining the relationship between pressure in the processing volume 104 and the position of the exhaust valve 126 is merely exemplary and other suitable methods may be possible. The method 400 or a similar method may be performed during any one or more of an initial chamber startup, scheduled chamber maintenance, change in process gas type, change of process recipe, change of system components, periodically, at random or the like.

Returning to FIG. 2, after the predetermined relationship has been determined, the method 200 may proceed to 204 where the process chamber 102 may be set to a first state having a first pressure in the processing volume 104 and a first value of the process parameter. For example, to obtain the first state, the exhaust valve 126 may be set to a first position based on the predetermined relationship to produce the first pressure in the processing volume at the first value of the process parameter. The first value may represent a single process parameter, for example, such as a flow rate, or many process parameters, for example, such as flow rate, temperature, magnitude of RF power, or the like as discussed above.

At 206, a pressure control profile may be determined to control pressure in the processing volume 104 as the process chamber 102 is set to a second state from the first state, where the second state has a second pressure and a second value of the process parameter. In some embodiments, the second pressure may be the same as the first pressure and the second value may be different than the first value. Alternatively, in some embodiments, the first and second pressure may be different and the first and second values of the process parameter may be different between the first and second states. Embodiments of a pressure control profile for embodiments of the first and second states of the process chamber are discussed below.

Figure 5:
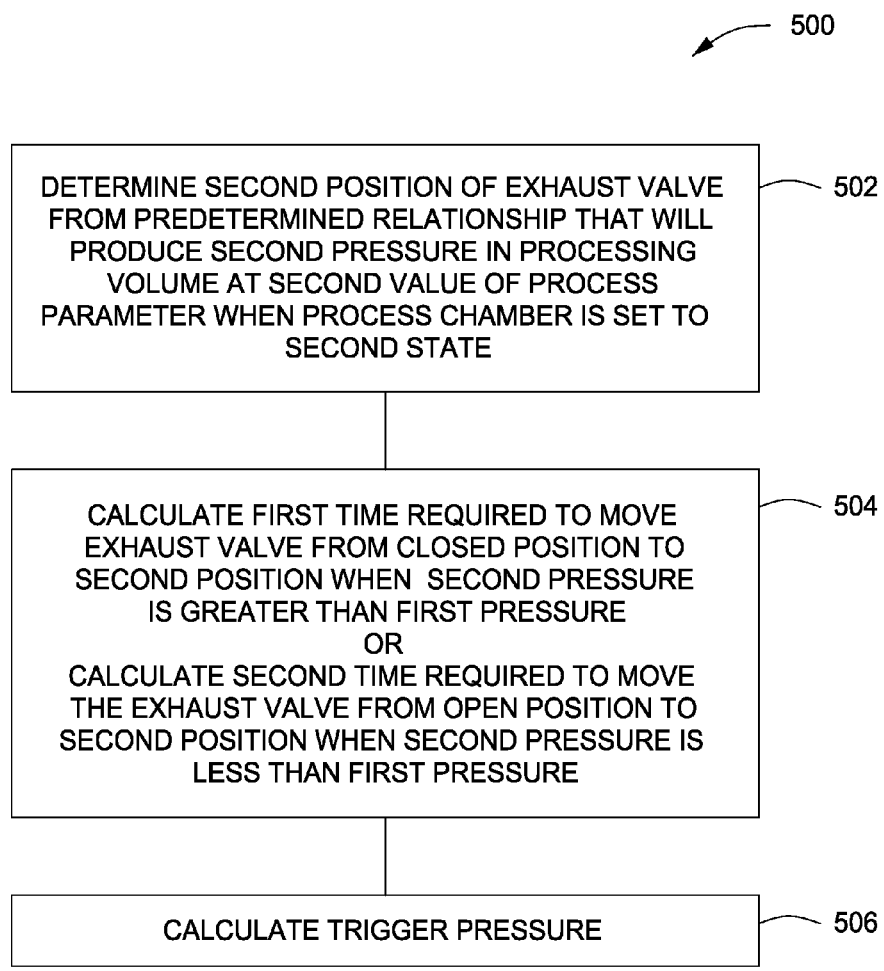
FIG. 5 depicts a flow chart of a method for determining a pressure control profile in accordance with some embodiments of the present invention.

For example, the pressure control profile may be generated by a model based control algorithm (e.g., the pressure control generator 304) that uses the first pressure, the second pressure, the first value, the second value, and the first position as input parameters. One exemplary method 500 for determining a pressure control profile is illustrated in the flow chart depicted in FIG. 5. The method 500 is merely exemplary and other methods for generating a pressure control profile are possible.

The method 500 begins at 502 by determining a second position of the exhaust valve 126 from the predetermined relationship that will produce the second pressure in the processing volume 104 at the second value of the process parameter when the process chamber 102 is set to the second state. For example, the second position that produces the second pressure in the processing volume 104 may be readily available and accessible, for example, from the memory 140 or alternatively may be computed by imputing inputting the second pressure and second value of the process parameter as inputs in the system model 302 to determine the second position of the exhaust valve 126 from the predetermined relationship.

At 504, when the second pressure is greater than the first pressure, a first time required to move the exhaust valve 126 from a closed position to the second position can be calculated. For example, when the second pressure is greater than the first pressure, the desired pressure increase from the first pressure to the second pressure may be achieved at a higher rate by moving the exhaust valve 126 to the closed position prior to moving the exhaust valve 126 to the second position. The first time can be calculated from the rate the exhaust valve 126 moves and the distance the valve 126 must move from the closed position to the second position.

Alternatively, when the second pressure is less than the first pressure, a second time required to move the exhaust valve from an open position to the second position can be calculated. For example, the open position may be a full open position of the exhaust valve 126. For example, the desired pressure decrease from the first pressure to the second pressure may be achieved at a higher rate by moving the exhaust valve 126 to the open position prior to moving the exhaust valve 126 to the second position. The second time can be calculated from the rate the exhaust valve 126 moves and the distance the valve 126 must move from the open position to the second position.

At 506, a trigger pressure can be calculated. The trigger pressure may be a pressure at which the exhaust valve 126 begins to move from the closed position to the second position when the second pressure is greater than the first pressure. Alternatively, the trigger pressure may be a pressure at which the exhaust valve 126 begins to move from the open position to the second position when the second pressure is less than the first pressure. For example, the trigger pressure may determined by solving an equation such as $P_{tg}=P_{cmd}-dP_{tg}/dt\,(T/2)$, where $P_{tg}$ is the trigger pressure, $P_{cmd}$ is the second pressure, $dP_{tg}/dt$ is the pressure differential at the trigger pressure, and T is either the first or second time as discussed above. For example, the pressure differential at the trigger pressure may be determined by solving the system model 302 for the pressure differential at each estimated value for the trigger pressure. The equation for trigger pressure may be solved by any suitable methods, such as non-linear optimization or the like.

For example, when the trigger pressure has not been exceeded, a second relationship between pressure and time using a set of initial conditions at the trigger pressure and a set of final conditions at the second pressure can be determined. For example, determining the second relationship may include solving a polynomial equation using the set of initial conditions at the trigger pressure and the set of final conditions at the second pressure. For example, the polynomial equation may be a second order polynomial equation for pressure as a function of time. However, other higher order polynomial equations, or other types of equations.

For example, when the trigger pressure has not been exceeded and the second pressure is greater than the first pressure, the set of initial conditions at the trigger pressure may be time (t)=0, pressure (P)=trigger pressure ($P_{tg}$), and pressure differential (dP/dt)=pressure differential at trigger pressure ($dP_{tg}/dt$) and the set of final conditions may be t=the first time as calculated at 504, P=the second pressure, and dP/dt=0. A similar set of initial and final conditions may be used to solve the polynomial equation when the second pressure is less than the first pressure, where the set of final conditions may be t=the second time as calculated at 504, P=the second pressure, and dP/dt=0. Accordingly, upon solving the polynomial equation, a pressure control profile has been determined between the trigger pressure and the second pressure for either the case where the second pressure is greater than the first pressure or the second pressure is less than the first pressure when the trigger pressure has not been exceeded.

Alternatively, when the trigger pressure has been exceeded, determining the pressure control profile can include calculating a third time required to move the exhaust valve from the first position to the second position. For example, the third time can be calculated from the rate the exhaust valve 126 moves and the distance the valve 126 must move from the first position to the second position. For example, the valve 126 may move directly from the first position to the second position by way of a pressure control profile, unlike embodiments discussed above where the trigger pressure has not been exceeded. For example, when the trigger pressure has not been exceeded the pressure control profile may be determined between the open or closed position and the second position.

When the trigger pressure has been exceeded, the second relationship between pressure and time can be determined using a set of initial conditions at the first pressure and a set of final conditions at the second pressure. For example, determining the second relationship may include solving the polynomial equation using the set of initial condition at the first pressure and the set of final conditions at the second position.

For example, when the trigger pressure has been exceeded, the set of initial conditions at the first pressure may be t=0, P=the first pressure and dP/dt=2(second pressure−first pressure)/third time and the set of final conditions may be t=the third time, P=the second pressure, and dP/dt=0. Accordingly, upon solving the polynomial equation, a pressure control profile has been determined between the first pressure and the second pressure for either the case where the second pressure is greater than the first pressure or the second pressure is less than the first pressure when the trigger pressure has been exceeded.

Figure 6:
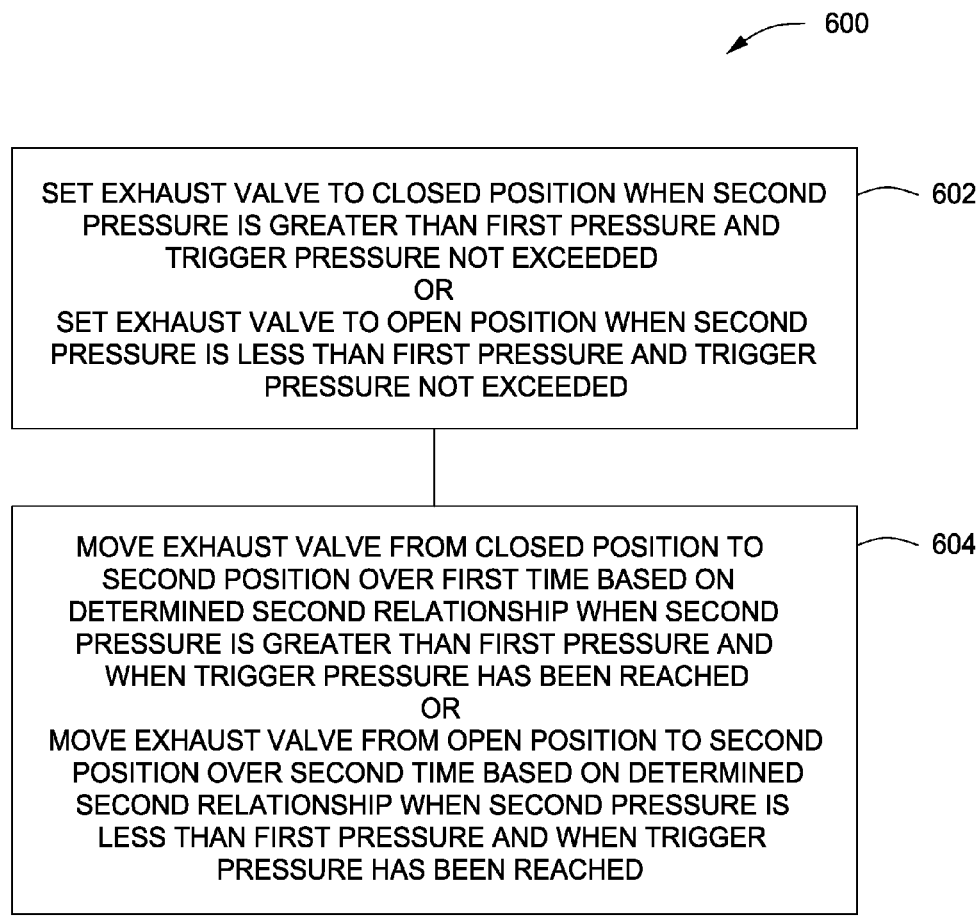
FIG. 6 depicts a flow chart of a method for applying a pressure control profile in accordance with some embodiments of the present invention.

Returning to FIG. 2, at 208, the pressure control profile determined above may be applied to control pressure in the processing volume by varying the position of the exhaust valve 126 while setting the process chamber 102 from the first state to the second state. For example, FIG. 6 depicts a flow chart for one exemplary method 600 for applying a pressure control profile in accordance with some embodiments of the invention.

For example, the method 600 may begin at 602, when the trigger pressure has not been exceeded, by setting the exhaust valve 126 to the closed position when the second pressure is greater than the first pressure, or setting the exhaust valve 126 to the open position when the second pressure is less than the first pressure. As discussed above, the closed position or the open position may be utilized to achieve a higher rate of pressure change.

At 604, the exhaust valve 126 may be moved from the closed position to the second position over the first time based on the determined second relationship (e.g., a pressure control profile) when the second pressure is greater than the first pressure and when the trigger pressure has been reached, or the exhaust valve 126 may be moved from the open position to the second position over the second time based on the determined second relationship when the second pressure is less than the first pressure and when the trigger pressure has been reached.

For example, moving the exhaust valve 126 from the closed position to the second position over the first time may include iteratively moving the exhaust valve 126 through a plurality of intermediate positions from the closed position to the second position of the exhaust valve 126. Each intermediate position may be determined from the predetermined relationship using a corresponding intermediate pressure and corresponding intermediate pressure differential as inputs in the predetermined relationship, wherein the corresponding intermediate pressure and the corresponding intermediate pressure differential are determined using the second relationship at a corresponding intermediate time between an initial time when the pressure has reached the trigger pressure and the first time.

Similarly, moving the exhaust valve 126 from the open position to the second position over the second time may include iteratively moving the exhaust valve 126 through a plurality of intermediate positions from the open position to the second position of the exhaust valve 126. Each intermediate position may be determined from the predetermined relationship using a corresponding intermediate pressure and corresponding intermediate pressure differential as inputs in the predetermined relationship, wherein the corresponding intermediate pressure and the corresponding intermediate pressure differential are determined using the second relationship at a corresponding intermediate time between an initial time when the pressure has reached the trigger pressure and the second time.

Alternatively, when the trigger pressure has been exceeded, the exhaust valve 126 may be moved from the first position to the second position over the third time based on the determined second relationship as discussed above.

For example, moving the exhaust valve 126 from the first position to the second position over the third time may include iteratively moving the exhaust valve 126 through a plurality of intermediate positions from the first position to the second position of the exhaust valve 126. Each intermediate position may be determined from the predetermined relationship using a corresponding intermediate pressure and corresponding intermediate pressure differential as inputs in the predetermined relationship, wherein the corresponding intermediate pressure and the corresponding intermediate pressure differential are determined using the second relationship at a corresponding intermediate time between an initial time when the exhaust valve is in the first position and the third time.

In operation, embodiments of the method 600 may be implemented using the exemplary command flow diagram depicted in FIG. 3. For example, the pressure profile may be determined as discussed above by the pressure profile generator 304. When the trigger pressure has been reached or the trigger pressure has been exceeded, the pressure profile generator 304 may output a command pressure ($P_{cmd}$) and pressure differential ($P_{cmd}/dt$) at each intermediate time which may be used as inputs to the system model 302. The system model 302 (i.e., the predetermined relationship) uses $P_{cmd}$ and $P_{cmd}$/dt, as well as the process parameter as inputs to determine a command position ($\theta_{cmd}$) for the exhaust valve 126. The command position ($\theta_{cmd}$) may be input to the motorized drive 132 to change the position of the exhaust valve 126 to an intermediate position between either the closed, the open, or the first positions and the second position. The pressure in the chamber 102 may be measured at the intermediate position of the exhaust valve 126 and compared to the command pressure, $P_{cmd}$. If the difference between the measured pressure and the command pressure does not fall within a desired tolerance level, the command pressure ($P_{cmd}$) and/or the command position ($\theta_{cmd}$) of the exhaust valve 126 may be adjusted by a standard proportional-integral-derivative (PID) control scheme 306 to achieve the desired tolerance level. The operation continues to iterate until the second position has been reached over either the first, the second, or the third times.

Alternatively, in some embodiments, the second pressure may be equal to the first pressure and the first value may be different from the second value of the process parameters. Accordingly, in such an embodiment the command pressure may be constant and the differential pressure may be zero, i.e., the pressure control profile may be flat. In embodiments where the pressure control profile is flat, the movement of the exhaust valve 126 from the first position to the second position may be controlled by the predetermined relationship (i.e., the system model 302). Further, the movement of the exhaust valve 126 from the first position to the second position may be necessary to maintain a constant pressure in the processing volume 104 as the first value of the process parameter is changed to the second value. For example, when the pressure is constant and the first value is different from the second value of the process parameter between the first and second states, moving the exhaust valve 126 may include iteratively moving the exhaust valve 126 through a plurality of intermediate positions from the first position to the second position of the exhaust valve 126. Each intermediate position may be determined from the predetermined relationship using the constant pressure and a corresponding intermediate value of the process parameter as inputs in the predetermined relationship. The corresponding intermediate value may be between the first value and the second value of the process parameter. Alternatively, the first value and the first position may be rapidly changed to the second value and the second position without gradually changing via a plurality of intermediate values.

Alternative methods to method 600 of determining and applying a pressure control profile are possible. For example, an alternative method may be based on a maximum velocity or acceleration achievable by the exhaust valve 126. For example, this alternative method may function on the rationale that a maximum rate of change in chamber pressure may be achieved by moving the exhaust valve 126 at a maximum velocity or acceleration towards an open or closed position (depending on the relative values of the first and second pressures) and then moving the exhaust valve 126 back to the second position, such that the exhaust valve 126 reaches the second position at about the precise moment that the second pressure is achieved. For example, if during the change from the first pressure to the second pressure, the exhaust valve 126 reaches a full open or closed position, the exhaust valve 126 should remain at the open or closed position for as long as possible prior to moving to the second position. For example, this alternative method may require the system dynamics model as discussed above to simulate a response for the system 100. For example, this alternative method may require an iterative approach to determine a pressure control profile. For example, a valve motion profile may be assumed and the resultant pressure response may be simulated using the system dynamics model. The valve motion profile may be refined based on the resultant pressure response for one or more iterations until a desired pressure response is achieved. This alternative method may be performed online or offline. For example, depending on the complexity of the calculation which may require one or more seconds to complete, this alternative method for determining the pressure profile may be performed offline.

Thus, methods and apparatus for processing a substrate using model-based control are provided herein. Embodiments of the inventive methods and apparatus may advantageously provide a faster transient response, such as stabilizing the chamber pressure at a new setpoint value when the chamber pressure is changed as a result of a change in processing conditions or the like. Further, the inventive methods and apparatus may advantageously facilitate anticipation of process changes within the substrate processing system. The anticipation, or feed-forward control, can advantageously facilitate more efficient substrate processing and/or higher throughput. The inventive methods may facilitate improved chamber matching between systems.

While the foregoing is directed to embodiments of the present invention, other and further embodiments of the invention may be devised without departing from the basic scope thereof.

The invention claimed is:

1. A method of controlling a process chamber having a processing volume, comprising:
    predetermining a relationship between pressure in the processing volume and a position of an exhaust valve disposed between the processing volume and an exhaust system as a function of a process parameter;
    setting the process chamber to a first state having a first pressure in the processing volume and a first value of the process parameter, wherein the exhaust valve is set to a first position based on the predetermined relationship to produce the first pressure in the processing volume at the first value;
    determining a pressure control profile to control the pressure in the processing volume as the process chamber is changed to a second state having a second pressure and a second value of the process parameter from the first state, wherein the pressure control profile is determined from a model based control algorithm that uses the first pressure, the second pressure, the first value, the second value, and the first position as input parameters; and
    applying the pressure control profile to control the pressure in the processing volume by varying the position of the exhaust valve while changing the process chamber to the second state from the first state.

2. The method of claim 1, wherein determining the pressure control profile further comprises:
    determining a second position of the exhaust valve from the predetermined relationship that will produce the second pressure in the processing volume at the second value of the process parameter when the process chamber is set to the second state.

3. The method of claim 2, wherein determining the pressure control profile further comprises:
    calculating a first time required to move the exhaust valve from a closed position to the second position when the second pressure is greater than the first pressure; or calculating a second time required to move the exhaust valve from an open position to the second position, wherein the open position is a full open position of the exhaust valve, when the second pressure is less than the first pressure.

4. The method of claim 3, wherein determining the pressure control profile further comprises:
calculating a trigger pressure, where the trigger pressure is a pressure at which the exhaust valve either begins to move from the closed position to the second position when the second pressure is greater than the first pressure to reach the second position in the first time, or begins to move from the open position to the second position when the second pressure is less than the first pressure to reach the second position in the second time.

5. The method of claim 4, wherein the trigger pressure had not been exceeded, and wherein determining the pressure control profile further comprises:
determining a second relationship between pressure and time using a set of initial conditions at the trigger pressure and a set of final conditions at the second pressure.

6. The method of claim 5, wherein determining the second relationship further comprises:
solving a polynomial equation using the set of initial conditions at the trigger pressure and the set of final conditions at the second pressure.

7. The method of claim 5, wherein applying the pressure control profile further comprises:
setting the exhaust valve to the closed position when the second pressure is greater than the first pressure; or
setting the exhaust valve to the open position when the second pressure is less than the first pressure.

8. The method of claim 7, wherein applying the pressure control profile further comprises:
moving the exhaust valve from the closed position to the second position over the first time based on the determined second relationship when the second pressure is greater than the first pressure and when the trigger pressure has been reached; or
moving the exhaust valve from the open position to the second position over the second time based on the determined second relationship when the second pressure is less than the first pressure and when the trigger pressure has been reached.

9. The method of claim 8:
wherein moving the exhaust valve from the closed position to the second position over the first time when the second pressure is greater than the first pressure and when the trigger pressure has been reached further comprises:
iteratively moving the exhaust valve through a plurality of intermediate positions from the closed position to the second position of the exhaust valve, wherein each intermediate position is determined from the predetermined relationship using a corresponding intermediate pressure and corresponding intermediate pressure differential as inputs in the predetermined relationship and where the corresponding intermediate pressure and the corresponding intermediate pressure differential are determined using the second relationship at a corresponding intermediate time between an initial time when the pressure has reached the trigger pressure and the first time; and
wherein moving the exhaust valve from the open position to the second position over a second time when the second pressure is less than the first pressure and when the trigger pressure has been reached further comprises:
iteratively moving the exhaust valve through a plurality of intermediate positions from the open position to the second position of the exhaust valve, wherein each intermediate position is determined from the predetermined relationship using a corresponding intermediate pressure and corresponding intermediate pressure differential as inputs in the predetermined relationship and where the corresponding intermediate pressure and the corresponding intermediate pressure differential are determined using the second relationship at a corresponding intermediate time between an initial time when the pressure has reached the trigger pressure and the second time.

10. The method of claim 4, wherein the trigger pressure has been exceeded, and wherein determining the pressure control profile further comprises:
calculating a third time required to move the exhaust valve from the first position to the second position; and
determining a second relationship between pressure and time using a set of initial conditions at the first pressure and a set of final conditions at the second pressure.

11. The method of claim 10, wherein applying the pressure control profile further comprises:
moving the exhaust valve from the first position to the second position over the third time based on the determined second relationship when the trigger pressure has been exceeded.

12. The method of claim 11, wherein moving the exhaust valve from the first position to the second position over the third time further comprises:
iteratively moving the exhaust valve through a plurality of intermediate positions from the first position to the second position of the exhaust valve, wherein each intermediate position is determined from the predetermined relationship using a corresponding intermediate pressure and corresponding intermediate pressure differential as inputs in the predetermined relationship and where the corresponding intermediate pressure and the corresponding intermediate pressure differential are determined using the second relationship at a corresponding intermediate time between an initial time when the exhaust valve is in the first position and the third time.

13. The method of claim 2, wherein the second pressure is equal to the first pressure and the second value of the process parameter is different from the first value, and wherein applying the pressure control profile further comprises:
moving the exhaust valve from the first position to the second position while maintaining a constant pressure equal to the first and second pressure, wherein moving the exhaust valve from the first position to the second position further comprises:
iteratively moving the exhaust valve through a plurality of intermediate positions from the first position to the second position of the exhaust valve, wherein each intermediate position is determined from the predetermined relationship using the constant pressure and a corresponding intermediate value of the process parameter as inputs in the predetermined relationship and where the corresponding intermediate value of the process parameter is between the first value and the second value of the process parameter.

14. The method of claim 1, wherein predetermining the relationship between pressure in the processing volume and the position of an exhaust valve further comprises:

modeling gas flow through the exhaust valve as a function of the process parameter to determine the predetermined relationship.

15. The method of claim 14, wherein modeling gas flow through the exhaust valve further comprises:
   (a) setting the exhaust valve to an open position;
   (b) setting the process parameter to a first test value;
   (c) iteratively moving the exhaust valve through a plurality of intermediate positions from the open position to the closed position of the exhaust valve and recording a corresponding pressure at each of the plurality of intermediate positions of the exhaust valve while maintaining the process parameter at the first test value; and
   (d) repeating (a)-(c) using a plurality of test values for the process parameter.

16. A method of controlling a process chamber having a processing volume and an exhaust valve disposed between the processing volume and an exhaust system for controlling a pressure in the processing volume comprising:
   setting the process chamber to a first state having a first pressure in the processing volume and a first value of a process parameter, wherein the exhaust valve is set to a first position to produce the first pressure in the processing volume at the first value based on a predetermined relationship between pressure in the processing volume and the position of the exhaust valve as a function of the process parameter; and
   applying a pressure control profile to control the pressure in the processing volume by varying the position of the exhaust valve while changing the process chamber to a second state having a second pressure and a second value of the process parameter from the first state, wherein the pressure control profile is determined from a model based control algorithm that uses the first pressure, the second pressure, the first value, the second value, and the first position as input parameters.

17. A system for processing semiconductor substrates, comprising:
   a process chamber having a processing volume;
   a processing source to provide a process parameter to the processing volume;
   an exhaust valve disposed between the processing volume and an exhaust volume of an exhaust system; and
   a controller coupled to the process chamber, wherein the controller further comprises computer readable medium having instructions stored thereon that, when executed by the controller, cause the controller to perform a method for controlling the process chamber, comprising:
      predetermining a relationship between pressure in the processing volume and a position of the exhaust valve as a function of the process parameter;
      setting the process chamber to a first state having a first pressure in the processing volume and a first value of the process parameter, wherein the exhaust valve is set to a first position based on the predetermined relationship to produce the first pressure in the processing volume at the first value;
      determining a pressure control profile to control the pressure in the processing volume as the process chamber is changed to a second state having a second pressure and a second value of the process parameter from the first state, wherein the pressure control profile is determined from a model based control algorithm that uses the first pressure, the second pressure, first value, the second value, and the first position as input parameters; and
      applying the pressure control profile to control the pressure in the processing volume by varying the position of the exhaust valve while changing the process chamber to the second state from the first state.

18. The system of claim 17, wherein the processing source comprises a mass flow device and wherein the mass flow device further comprises:
   a sensor; and
   an adjustable valve, wherein the sensor and the adjustable valve of the mass flow device are directly coupled to the controller.

19. The system of claim 17, further comprising:
   a first pressure gauge to measure a first range of pressure in the processing volume; and
   a second pressure gauge to measure a second range of pressure in the processing volume, wherein the first and second pressure gauges are directly coupled to and controlled by the controller.

20. The system of claim 17, further comprising:
   a motorized drive to change a position of the exhaust valve, wherein the motorized drive is directly coupled to and controlled by the controller.

21. The method of claim 1, wherein the predetermined relationship is a model for the exhaust valve that has (a) one or more of chamber pressure, differential chamber pressure, chamber temperature, chamber volume, or the process parameter as inputs to the model, and (b) a position of the exhaust valve as an output of the model.

* * * * *